United States Patent [19]

Otsubo et al.

[11] Patent Number: 4,479,848

[45] Date of Patent: Oct. 30, 1984

[54] ETCHING METHOD AND APPARATUS

[75] Inventors: Toru Otsubo, Fujisawa; Susumu Aiuchi; Takashi Kamimura, both of Yokohama, all of Japan

[73] Assignee: Hitachi, Ltd., Tokyo, Japan

[21] Appl. No.: 579,941

[22] Filed: Feb. 14, 1984

[30] Foreign Application Priority Data

Feb. 14, 1983 [JP] Japan ................................ 58-21423

[51] Int. Cl.³ ...................... H01L 21/306; B44C 1/22; C03C 15/00; C23F 1/02
[52] U.S. Cl. .................................. 156/626; 156/643; 156/345; 356/445
[58] Field of Search ............... 156/626, 627, 643, 646, 156/345, 655, 656, 657, 659.1, 662; 204/192 E, 298; 356/141, 381, 445

[56] References Cited

U.S. PATENT DOCUMENTS 4,198,261  4/1980  Busta et al. ..................... 156/626

FOREIGN PATENT DOCUMENTS

112670  2/1978  Japan ................................ 156/626
92835  6/1982  Japan ................................ 156/626

*Primary Examiner*—William A. Powell
*Attorney, Agent, or Firm*—Antonelli, Terry & Wands

[57] ABSTRACT

The present invention consists in an etching method and apparatus wherein an optical image which is reflected from a region of a dicing stripe pattern on a substrate to-be-etched, such as a semiconductor wafer, is focused by a projecting optical system during selective etching. The focused pattern is converted into an image signal by an image detector, and a change of contrast in the region of the dicing stripe pattern is determined from the image signal. Based on this, an ending time for the etching can be decided from the change of contrast.

14 Claims, 20 Drawing Figures

ETCHING METHOD AND APPARATUS

BACKGROUND OF THE INVENTION

The present invention relates to an etching method and apparatus in which a pattern formed on the surface of an object to-be-etched is directly monitored, whereby the etching is automatically controlled in-process.

Lithography for forming the patterns of an IC and an LSI includes the so-called wet etching process which employs chemicals, and dry etching process which resorts to a reactive gas in a plasma. The dry etching process is excellent in the dimensional accuracy of the etched pattern, and forms the mainstream technique of the LSI and VSLI. On the other hand, however, the ratio between the etching rates of a photoresist serving as a mask and a desired material to-be-etched or another material underlying the desired material to-be-etched is as small as 2–15 when compared with about 50 in the case of the wet etching process. It is therefore important to properly and accurately detect the end point of the etching, to stop the etching and to prevent the progress of surplus etching. If the detection of the end point of the etching is inaccurate, the etching is incomplete. Conversely, if the etching period of time becomes longer than an appropriate value, the photoresist being the etching mask and/or a layer underlying the desired material to-be-etched can become undesirably corroded.

As methods for detecting the end point of the etching with the plasma, there are (1) the emission spectrographic method which detects light emitted by a seed electrically excited by glow discharge, an etching product or a reactive etching seed, (2) the light reflection method in which, by utilizing the change of the reflection factor of a material under etching or the interference effect of light of a thin film under etching, the reflection factor of light of the material under etching is measured as a function of time and the thickness of the film is monitored, (3) the method in which a seed in a gas stream introduced into an etching reactor or a reaction product substance is sampled and is analyzed mass-spectrographically so as to sense the change of a signal with the progress of etching, (4) the method which measures the change of a plasma impedance owing to fluctuations in the concentration of a reaction seed and the concentration of an etching product that change with the progress of etching, (5) the method in which the density of electrons or the distribution of electronic and ionic energies fluctuating due to the change of the composition of a plasma attendant upon the progress of etching is observed by the use of a Langmuir probe, and (6) the method which measures the fluctuations of a pressure in an etching vessel changing with the progress of etching. The known methods stated above are described in detail in "Methods of Detecting End Points of Plasma Etching" (July 1981/Solid State Technology/Japanese Version, page 62) by Paul J. Marcoux Pang Dow Foo.

Figure 1:
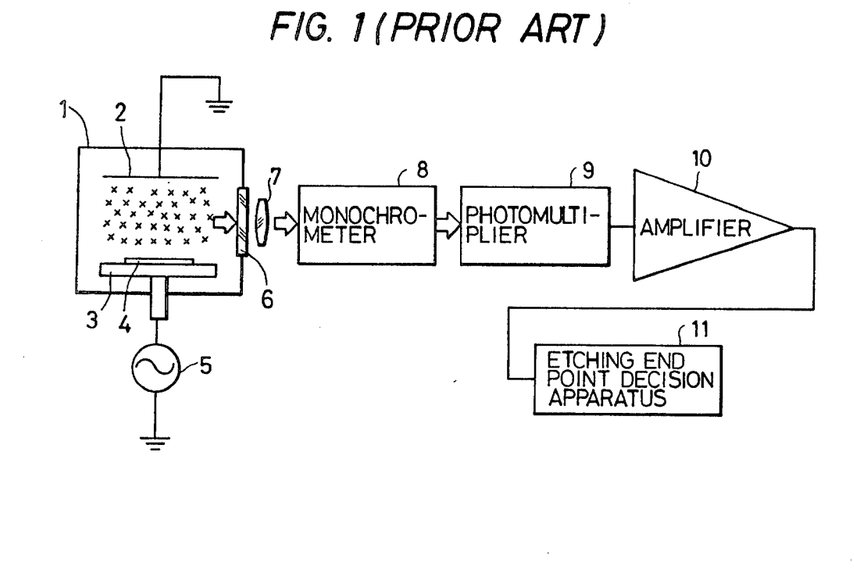
FIG. 1 is an arrangement diagram of an etching end point detection device and an etching chamber in a prior-art emission spectrographic method.

Regarding the emission spectrographic method which is used most extensively among the techniques listed above, the problems of the prior art will be described with reference to FIG. 1.

An etching processing chamber 1, in which an upper electrode 2 and a lower electrode 3 are installed, is provided with a lighting window 6 for taking out light emission based on the discharge plasma between the electrodes. A lens 7, a monochrometer 8 and a photomultiplier 9 are disposed on an identical optic axis outside the lighting window 6. The output of the photomultiplier 9 is amplified by an amplifier 10, and then sent to an etching end point decision device 11.

A gas is introduced into the etching processing chamber 1 from an etching gas feed device, not shown, and the chamber is evacuated by a vacuum pump, not shown, whereby the interior of the processing chamber is held at a fixed pressure (0.5–50 Pa). When a high frequency voltage is applied across the upper electrode 2 and lower electrode 3 from a radio frequency power source 5, glow discharge arises across the electrodes, and the etching of a wafer 4 on the lower electrode 3 is started. The emission based on the plasma discharge is fed into the monochrometer 8 through the lighting window 6, to take out from within the emission of the discharge only the light of a wavelength which changes with a correlation to the progress of the etching. For example, in the etching of Al, the light of a wavelength of 396 nm which is one of the emission spectrum of Al molecules is separated by the monochrometer 8, and the intensity variation thereof is measured by the photomultiplier tube 9. Then, output changes which correspond to the situations of the starting of the discharge and the starting and end of the etching of the Al are measured. The output signal is electrically processed by the end point decision device 11, to detect the end point of time of the etching.

Figure 2:
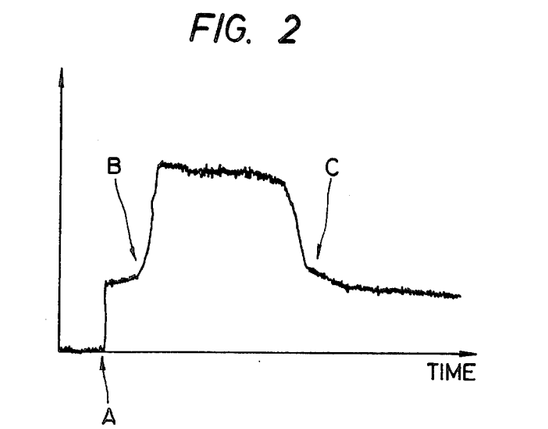
FIG. 2 is a diagram for explaining the feature of an output signal in the emission spectrographic method.

With the emission spectrographic method, changes in the intensity of the plasma emission arise due to pressure fluctuations in the etching processing chamber and output fluctuations of the radio frequency power source. It is therefore difficult to accurately decide the point of time of the completion of the etching. Moreover, as illustrated in FIG. 2, the change of the output signal (indicated by current) of the photomultiplier tube near the point of time of the completion of the etching is not abrupt though great in the changing rate, so that a dispersion in the decisions occurs. In FIG. 2, A denotes the starting time of the discharge, B the starting time of the etching, and C the end time of the etching.

This method detects the reaction seed or etching product which exists between the electrodes, and needs to directly and accurately obtain the correlation with the etched state of the wafer surface in advance. It involves such problems that the correlation is affected by the flow of the etching gas or an organic reaction product adhering to the wall of the processing chamber or the electrode, and that the correlation slightly differs depending upon the lighting range. It has accordingly been difficult to detect the etching end point at high precision.

Meanwhile, as disclosed in Japanese Laid-open patent application No. 53-138943, the light reflection method is the method in which the surface state of the material to be etched is directly observed, and hence, it is free from the indistinctness as involved in the emission spectrographic method stated above. In LSI wafers etc., however, the reflection factors of the surfaces of the materials to be etched differ depending upon lots, and a certain degree of dispersion (e.g., 20% in case of Al) is included. Moreover, the method is affected by the change of the emission intensity ascribable to the instability of the plasma discharge and is difficult to detect only the variation of the reflection factor, so that the S/N (signal-to-noise) ratio worsens. With the method which utilizes the interference of light on the surface of the material to-be-etched employing a laser beam, signals to intensify the light and signals to weaken it appear several times with the progress of etching. Therefore, the end point detection algorithm becomes complicated, and the decision is liable to err. Besides, in a case where a material of good light transmission is concerned or where the reflection at the boundary between the underlying material and the substance to-be-etched is intense, a comparatively favorable result is obtained, but in any other case, the signal which is obtained is generally inferior in the S/N ratio. Another disadvantage is that, when a fine pattern exists on the surface of the material to-be-etched, a signal of good S/N ratio is not obtained.

SUMMARY OF THE INVENTION

An object of the present invention is to eliminate the disadvantages of the prior arts, and to provide an etching method and apparatus in which the completion of etching in etching processing can be precisely detected by directly detecting the surface state of a material to-be-etched with a signal of good S/N ratio.

To the accomplishment of the object, the present invention has been made with note taken of the fact that individual stripes of a dicing stripe pattern formed on a substrate to be etched can have a width of 50–100 μm, for example, and can therefore be optically recognized satisfactorily. Note is also taken of the fact that the reflection factors of a resist layer and an Al layer before etching are conspicuously different from the reflection factor of underlying $SiO_2$ exposed by the completion of the etching. Accordingly, the present invention is characterized in that a region of a dicing stripe pattern on a substrate to be etched is focused by a projecting optical system during selective etching, that the focused pattern is converted into an image signal by a photoelectric transducer, and that a change of contrast in the region of the dicing stripe pattern is obtained from the converted image signal, so as to detect the progress or completion of the etching.

Particularly in the present invention, an optical image is detected by an image detector for a region of the dicing stripe pattern, radio frequency and low frequency components are removed from an image signal obtained from the image detector, and a change of contrast is sensed on the basis of the fact that the resulting image signal has fallen in excess of a predetermined threshold value, so as to decide the end of the etching.

Further, in the present invention, an optical image is detected by an image detector for a region of the dicing stripe pattern, an image signal obtained from the image detector is turned into binary coded picture elements with a predetermined threshold value, the proportion of black/white of the binary coded picture element signal is calculated, and a change of contrast is sensed on the basis of the fact that the proportion has exceeded a predetermined threshold value, so as to decide the end of the etching.

DETAILED DESCRIPTION OF THE PREFERRED EMBODIMENTS

Figure 3:
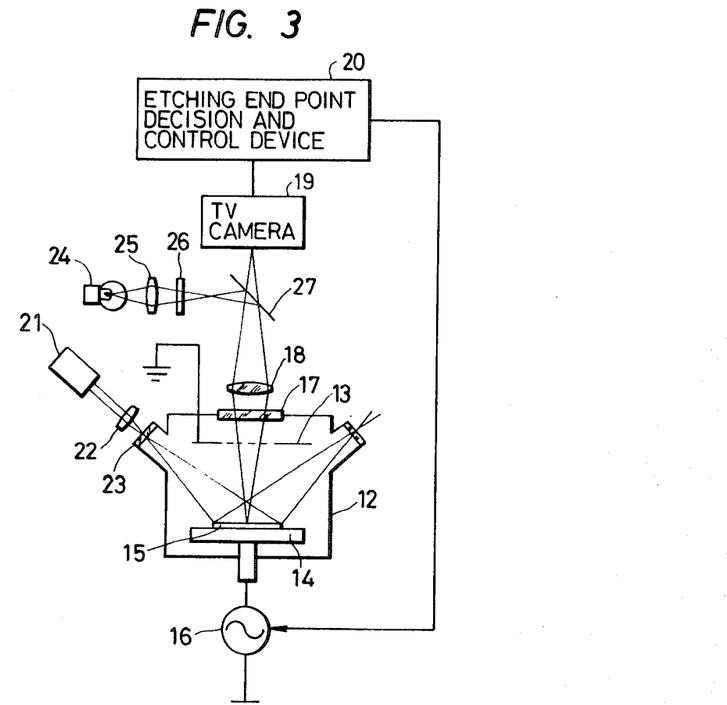
FIG. 3 is an arrangement diagram of an etching apparatus according to the present invention.

FIG. 3 is a diagram illustrative of the arrangement of an etching apparatus according to the present invention. Parallel plate electrodes consisting of an upper electrode 13 and a lower electrode 14 are installed in an etching processing chamber 12. The lower electrode 14 has a radio frequency power source 16 connected thereto, and the opposing upper electrode 13 is held at ground potential. In addition, a part of the upper electrode 13 is constructed as a mesh, and a transparent glass window 17 is provided in a part of the processing chamber 12, whereby a wafer 15 on the lower electrode 14 can be observed from above. Further, a lens 18 and an imaging TV camera 19 are installed over the glass window 17, and the output signal cable of the TV camera 19 is connected to an etching end point decision and control device 20. The output of the etching end point decision and control device 20 is applied to the radio frequency power source 16.

While an etching gas is being supplied from a gas feed device, not shown, into the etching processing chamber 12 and the interior of the etching processing chamber is being evacuated by a vacuum pump, not shown, the interior of the chamber is held at a fixed pressure (0.5–50 Pa). Under this state, a radio frequency voltage (13.5 MHz) is applied to the lower electrode 14 from the radio frequency power source 16 so as to generate glow discharge between it and the upper electrode 13. Then, the front surface of the wafer 15 is etched by ion end radicals in a plasma.

The apparatus is so arranged that the surface pattern of the wafer 15 during etching is projected on the imaging device plane of the TV camera 19 by the lens 18. The net of the upper electrode 13 is held close to the lens 18, whereby the surface pattern of the wafer 15 is picked up as a clear image by the TV camera.

In a part of the etching processing chamber 12, a glass window 23 is provided separately from the glass window 17. The apparatus is so arranged that a beam emitted from a laser oscillator (e.g., Ar laser oscillator) 21 is magnified by a lens 22 and then projected on the whole surface of the wafer 15 through the glass window 23. Besides, the apparatus may well be so arranged that a semitransparent mirror 27 is interposed between the lens 18 and the TV camera 19 and that light emitted from a lamp 24 is projected on the wafer 15 through a lens 25, a color filter 26, the semitransparent mirror 27, the lens 18 and the glass window 17. Either illumination from the laser oscillator 21 or lamp 24 may be employed.

Next, a method of monitoring the progress of etching will be described by taking the semiconductor wafer as an example.

Figure 4:
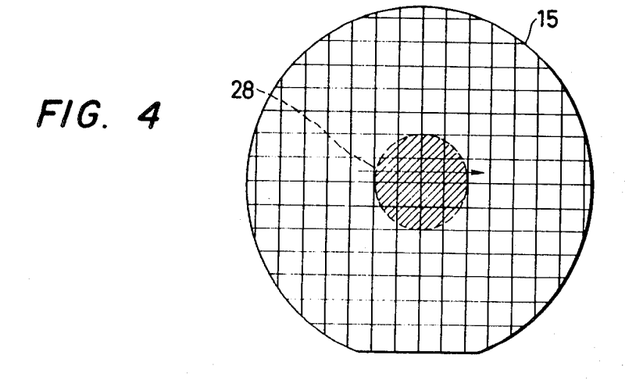
FIG. 4 is a diagram showing a pattern detection region.
Figure 5A:
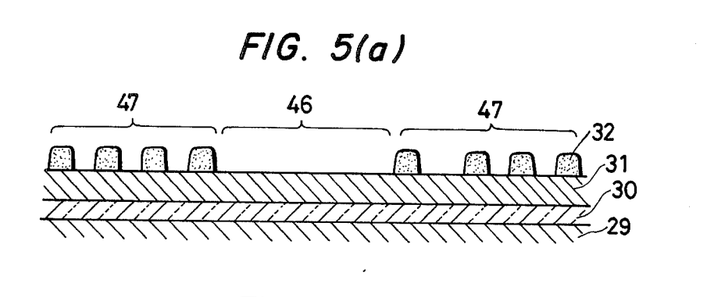
FIGS. 5(a) to 5(c) are sectional views of a part near the surface of a material to-be-etched for explaining changes with the progress of etching.
Figure 5B:
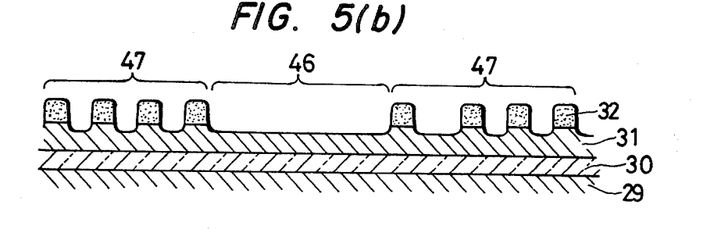
Figure 5C:
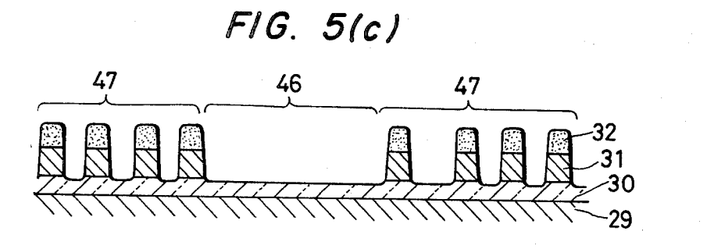

FIG. 4 shows the surface pattern detection region 28 focused on by the TV camera 19 of the wafer 15 on the lower electrode 14. FIGS. 5(a) to 5(c) show sectional views illustrative of a scribing area 46 which falls within the detection region 28 of the TV camera 19 on the wafer 15. $SiO_2$ 30, Al 31 and a photoresist 32 are formed on a substrate material Si 29, and the Al 31 is etched and worked with the photoresist 32 as a mask. Numeral 46 indicates the scribing area, and numeral 47 a semiconductor circuit chip pattern. (a) depicts the state before the starting of the etching, FIG. 5(b) the state in the course of the etching, and FIG. 5(c) the state or the so-called overetch in which the etching of the Al 31 has been completed and the underlying $SiO_2$ 30 is also etched.

Figure 6:
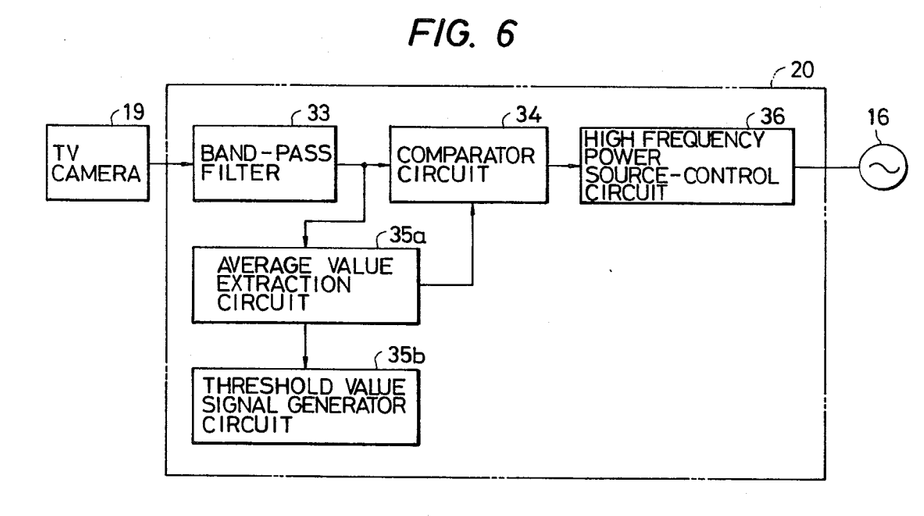
FIG. 6 is a block diagram of an etching end point decision and control device in a first aspect of performance of the present invention.

FIG. 6 shows a part of the internal circuit arrangement of the end point decision device 20. The video signal of the TV camera 19 is led to a band-pass filter 33, the output of which is connected to a comparator circuit 34. A threshold signal generator circuit 35b and a radio frequency power source-control circuit 36 are connected to the same comparator circuit 34. Shown at 35a is an average value extraction circuit which finds the average value Va of the signal obtained from the band-pass filter 33.

Figure 7A:
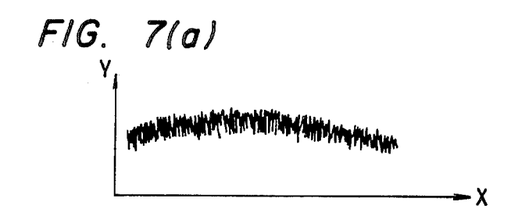
FIGS. 7(a) to 7(e) are waveform diagrams of various parts for explaining a signal processing method within the etching end point decision and control device.
Figure 7B:
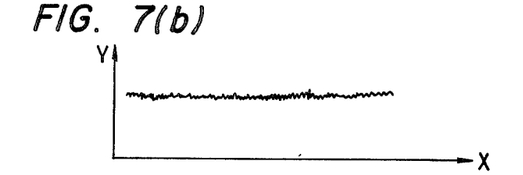
Figure 7C:
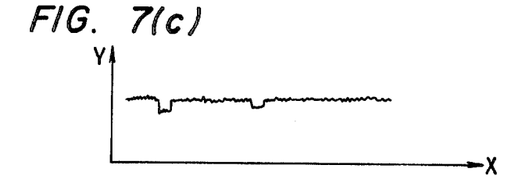
Figure 7D:
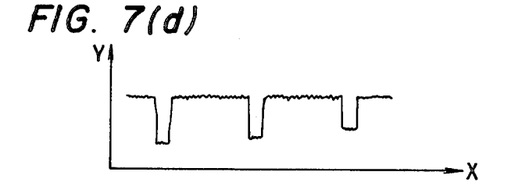
Figure 7E:
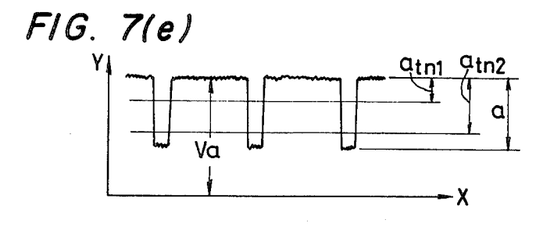

Next, the operation will be described with reference to FIGS. 7(a) to 7(e) showing the output signal waveforms of principal portions. A signal shown in FIG. 7(a) is the video signal of the TV camera in the case where a part of an arrow in the pattern detection region shown in FIG. 4 is being scanned. It is passed through the band-pass filter 33 to block unfavorable low frequency and radio frequency components and to obtain a signal of little noise shown in FIG. 7(b). As the etching progresses, the Al 31 is gradually corroded and thinned as shown in FIG. 5(b), and through the underlying $SiO_2$ 30, the Si 29 of the still lower layer comes to be seen faintly. With the etching, therefore, signal changes corresponding to the stripe pattern of the scribing area are seen, and a signal shown in FIG. 7(c) is obtained. When the etching has further progressed, the signals of the stripe pattern parts of the scribing area 46 become distinct as shown in FIG. 7(d). After the etching of the Al 31 has been completed, the signal amplitudes a of the stripe pattern parts become substantially constant as shown in FIG. 7(e). The threshold value signal generator circuit 35b which receives the output signal Va of the average value extraction circuit 35a is connected to the comparator circuit 34. Therefore, any desired threshold value signal Va - $a_{th1}$ or Va - $a_{th2}$ is generated and is compared with the signal shown in FIG. 7(e). When Va - a has become smaller than Va - $a_{th2}$, the comparator circuit 34 sends a signal to the radio frequency power source-control circuit 36, to control input power to the etching lower electrode 14. By way of example, the etching can be stopped by cutting off the radio frequency power source at the point of time at which Va - a has become smaller than Va - $a_{th2}$. In addition, a proper overetched state can be produced by cutting off the radio frequency power source a fixed period of time after Va - a has become smaller than Va - $a_{th2}$. Further, depending upon the magnitudes of the threshold value Va - $a_{th2}$, an underetching condition or optimum etching completion condition can be obtained. The signals shown in FIGS. 7(a) to 7(e) correspond to the case where the wafer is illuminated by the constituents 24, 25, 26 and 27. In the case of the illumination by the constituents 21, 22 and 23, the light and darkness become opposite to those of the signals shown in FIGS. 7(a) to 7(e).

The above is based on the fact that the reflection factors of the photoresist 32, Al 31, $SiO_2$ 30 and Si 29 are respectively different and that the colors to be observed are also different. In particular, the Al is close to a mirror surface or white and has a high reflection factor of 40-80%, whereas the Si has a reflection factor of 10-20%, so that the difference of the reflection factors of the Al and Si is great. With the TV camera 19, a fine circuit pattern of 2-3 μm on the wafer cannot be detected. It has been experimentally verified, however, that the ordinary dicing stripe pattern having stripes of 50-100 μm in width can be satisfactorily detected.

In the above example, the difference of the reflection factors of the Al and Si is comparatively great, and the reflected light from the wafer is detected by utilizing the light emission of the plasma. However, in a case where the difference of reflection factors is small, the discernment of the pattern sometimes becomes difficult due to the light emission itself of the plasma. At this time, the wafer 15 is illuminated with light of special wavelengths by employing the lamp 24, lens 25, color filter 26 and semitransparent mirror 27 shown in FIG. 3. That is, the color filter 26 the spectral wavelength characteristic of the transmissive light of which is set at a desired value is employed. By way of example, when an interference filter which transmits wavelengths of 530-560 nm of excellent monochromaticity is used, the wafer 15 having been seen in the emission color of the plasma close to white is observed in the color of green, and the dicing stripe pattern comes to be seen clearer. A pattern detection signal of good S/N (signal-to-noise) ratio is obtained in the video signal of the TV camera 19. When an Ar laser is used in the illumination by the laser oscillator 21 and the lens 22, similar wavelengths are produced, and the same functional effect is attained.

The above is based on the fact that, in case of different materials, spectral reflectance characteristics differ correspondingly.

Another method for obtaining a good pattern detection signal is that the laser beam emitted from the laser oscillator 21 is obliquely projected on the wafer 15. Since the greater part of the laser beam reflected from the wafer 15 does not reach the TV camera 19, light irregularly reflected by a pattern formed by the etching, namely, by slight step parts reaches the TV camera 19. Therefore, when the etching progresses, the step formed anew begins to be seen bright, and hence, the good pattern detection signal is obtained. The etching can accordingly be controlled by controlling the input power to the high frequency power source with this detection signal and according to the foregoing method.

While, in this embodiment, the method of controlling the input power to the radio frequency power source 16 has been described, the etching is of course controllable by controlling the etching pressure at will in such a way that the quantity of the etching gas to be introduced into the etching processing chamber 12 is controlled or that the exhaust rate of the vacuum exhaust system is controlled by a variable orifice.

When, in the above embodiment, the etching end point decision and control device is constructed as described below, the apparatus is more advantageous.

Figure 8:
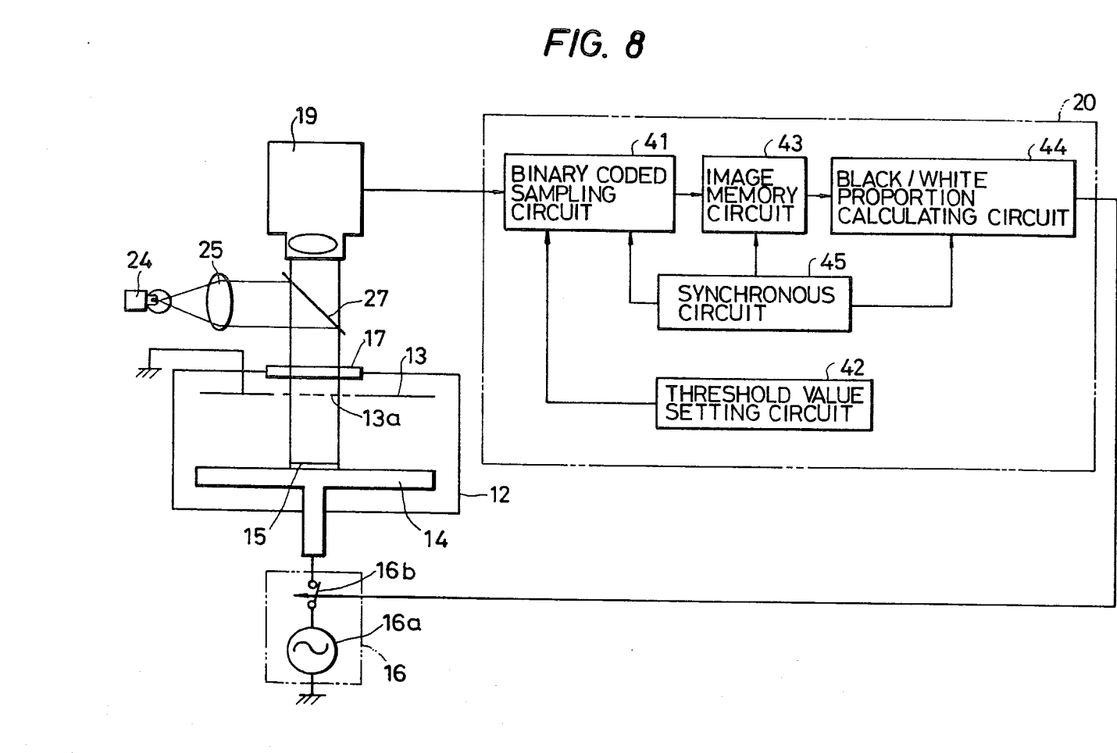
FIG. 8 is an arrangement diagram of an etching apparatus according to the present invention, the apparatus including an etching end point decision and control device in a second aspect of performance of the present invention shown block diagram.

In FIG. 8, reference numerals common to those in FIG. 3 denote the same parts as in FIG. 3. In this embodiment, the etching end point decision and control device 20 consists of a binary coded sampling circuit 41, a threshold value setting circuit 42, an image memory circuit 43, a black/white proportion calculating circuit 44, and a synchronous circuit 45 for applying required timing signals to the respective circuits 41, 43 and 44. The operation of this device will be described as to a case of etching a wafer shown in FIG. 9(a).

Figure 9A:
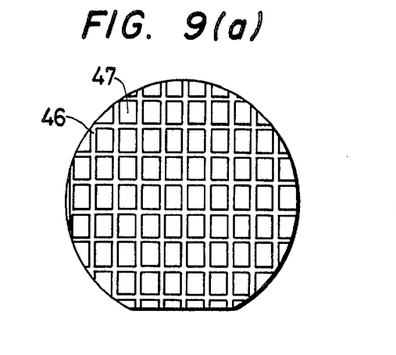
FIGS. 9(a) to 9(c) and 10(a) to 10(c) show the reflection images and two-valued images of a wafer surface for explaining the operation of the apparatus shown in FIG. 8, respectively.
Figures 9B, 10B:
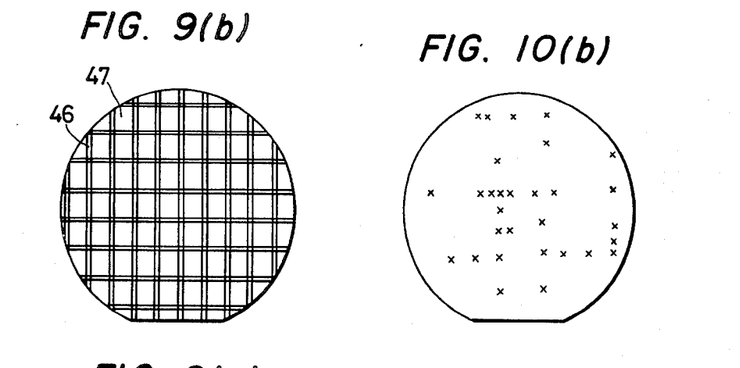

In FIG. 9(a), numeral 46 indicates the stripe pattern being the scribing area out of a wafer pattern, and a semiconductor circuit pattern part 47 enclosed with the stripe pattern 46 corresponds to one chip of a semiconductor. The stripe pattern 46 on a wafer surface is a part which is not coated with a photoresist. A material to be etched is corroded by etching, with the result that an underlying layer appears and reflected light changes greatly. In contrast, the circuit pattern part 47 is coated with the photoresist at a proportion of about 40%. Therefore, even when the wiring of the circuit pattern is corroded by the etching, the change of the reflected light is little. FIG. 9(b) shows the state in the course of the etching, and FIG. 9(c) the state near the end of the etching.

Figures 9C, 10C:
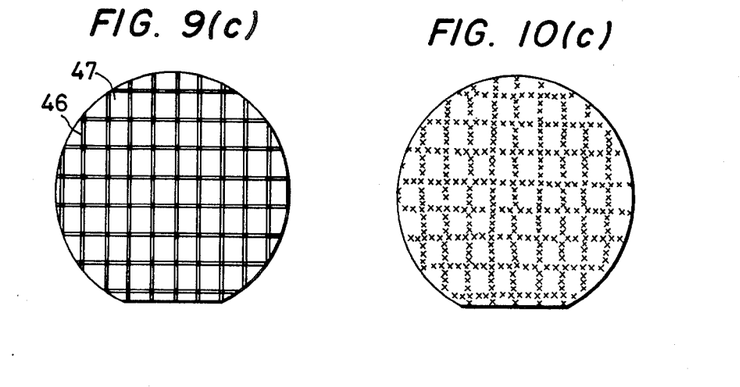
Figure 10A:
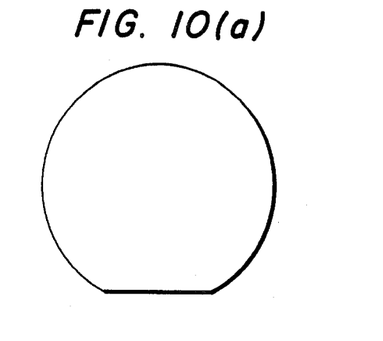

FIGS. 10(a) to 10(c) show two-valued images which are inputted to the image memory circuit 44 and which correspond to FIGS. 9(a) to 9(c), respectively.

In the etching processing chamber 12, there are held an etching gas of a flow rate corresponding to a predetermined etching process, for example, $CCl_4$ of 50 cc/min. and a fixed pressure, for example, 9 Pa. A discharge starting/stopping switch 16b is turned "on" to apply radio frequency power of 400 W at 13.56 MHz, for example, across the lower electrode 14 and the upper electrode 13 from a radio frequency power source 16a. Then, plasma glow discharge arises across the lower electrode 14 and upper electrode 13, and the front surface of the wafer 15 is etched.

In parallel with the etching, the light of the illuminating light source 24 disposed outside the etching processing chamber 12 is reflected by the semitransparent mirror 27 through the lens 25 so as to illuminate the surface of the wafer 15 under etching through the glass window 17 mounted on the etching processing chamber 12 and the meshed part 13a of the upper electrode 13, while the reflected light of the wafer surface is introduced into the TV camera 19 through the meshed part 13a of the upper electrode and the semitransparent mirror 27 along a path reverse to that of the illuminating light. The TV camera 19 converts the reflected image of the wafer surface into an image signal. This image signal changes with the progress of the etching shown in FIGS. 9(a) to 9(c). The image signal is applied to the binary coded sampling circuit 41. At the timing of the synchronous signal of the synchronous circuit 45, the image signal is binary coded by a threshold value which is delivered from the threshold value setting circuit 42 and which is set at a predetermined value (for example, 0.7 V for an image signal of a full range of 1 V) at the starting of the etching. Then, the binary and picture element image becomes as shown in FIGS. 10(a) to 10(c). Next, the binary and picture element images are stored in the image memory circuit 43 by the required synchronous signals of the synchronous circuit 45, while the black/white proportions of the images are calculated from the stored contents of the image memory circuit 43 by the black/white proportion calculating circuit 44 in response to the required synchronous signals of the synchronous circuit 45. The black/white proportions are, for example, (a) 0%, (b) 2%, and (c) at least 17%. By way of example, the point of time at which black/white = 17% has been detected is set as the end time of the etching. Then, when the point of time has been decided, or in some cases, after the etching has been further continued (overetching) for a predetermined period of time, the discharge starting/stopping switch 16b of the radio frequency power source circuit 16 is turned "off". Thus, the continuation period of time of the etching discharge can be controlled. It is to be understood that the specified region (e. g., cross scribing area) of the image detected by the TV camera may well be extracted and stored in the image memory circuit 43.

According to this aspect of performance, the reflected image of the wafer surface exposed to the plasma during the etching is binary coded by the predetermined fixed threshold and then received, and the change of the black/white proportion is observed, whereby the progress of the etching of the wafer surface can be directly monitored. Therefore, it becomes possible to detect the end point of the etching at high precision and with good reproducibility, and this is effective to enhance the product yield of the semiconductor.

In the present embodiment, dry etching based on the parallel plate electrodes has been described. It is to be understood, however, that the etching means is not restrictive in the present invention, but that the invention can also be performed in cylindrical plasma etching equipment and wet etching equipment.

As set forth above, according to the present invention, the state change of the etching pattern of the surface of a material to-be-etched can be measured in-process directly by optical means. Therefore, the invention has solved the problem found in other indirect methods, such as the emission spectrography or the mass spectrography, that the end point of the etching is indistinct. It has also solved the problem of the light reflection method that a signal of good S/N ratio cannot be obtained, so the error of the end point detection of the etching cannot be decreased to below $\pm 10\%$. End point detection at a high precision of within $\pm 1\%$ has been realized, and the available percentage of LSIs has been enhanced. In particular, the effect of enhancing the available percentage of LSIs having the specification of an allowable overetching amount of $\pm 10\%$ or less is remarkable.

We claim:

1. An etching method comprising the step of focusing by a projecting optical system an optical image which is reflected from a region of a dicing stripe pattern on a substrate to-be-etched during selective etching, the step of converting the focused pattern into an image signal by an image detector, the step of finding a change of contrast in the region of the dicing stripe pattern on the basis of the image signal, and the step of deciding a state of etching on the basis of the found change of contrast.

2. An etching method according to claim 1, wherein said substrate to be etched is a semiconductor wafer for forming a semiconductor circuit.

3. An etching method according to claim 2, wherein said semiconductor wafer has underlying $SiO_2$, which is overlaid with an Al layer, which is further overlaid with a resist for the selective etching.

4. An etching method according to claim 1, wherein the etching state to be decided is an end of the etching.

5. An etching apparatus comprising:
(a) an etching processing chamber in which a substrate to be etched is received,
(b) illumination means to illuminate said substrate to-be-etched,
(c) a projecting optical system which focuses an optical image reflected from a region of a dicing stripe pattern on said substrate to-be-etched,
(d) an image detector which converts the pattern focused by said projecting optical system, into an image signal, and
(e) decision means to decide an etching state on the basis of the fact that a change of the image signal obtained from said image detector has exceeded a predetermined value.

6. An etching apparatus according to claim 5, wherein an optic axis of said projecting optical system is perpendicular to said substrate to-be-etched.

7. An etching apparatus according to claim 6, wherein said decision means is constructed of a band-pass filter which removes high frequency and low frequency components of the image signal obtained from said image detector, and comparison means to detect that a part of a signal obtained from said band-pass filter, corresponding to the dicing stripe pattern, has exceeded a predetermined threshold value set in advance.

8. An etching apparatus according to claim 6, wherein said decision means is constructed of a binary coded picture element circuit which turns the image signal obtained from said image detector, into binary coded picture elements with a predetermined threshold value, black/white proportion calculation means to calculate a proportion of black/white on the basis of the binary coded picture element signal obtained from said binary coded picture element circuit, and comparison means to detect the fact that the proportion of black/white obtained by said black/white proportion calculation means has exceeded a predetermined value.

9. An etching apparatus according to claim 7 wherein said illumination means expands a laser beam of specified wavelengths and projects the expanded beam on said substrate to-be-etched in a direction oblique thereto.

10. An etching apparatus according to claim 7 wherein said illumination means projects light of specified wavelengths on said substrate to-be-etched in a direction perpendicular thereto by the use of a filter.

11. An etching method according to claim 2, wherein the etching state to be decided is an end of the etching.

12. An etching method according to claim 3, wherein the etching state to be decided is an end of the etching.

13. An etching apparatus according to claim 8, wherein said illumination means expands a laser beam of specified wavelengths and projects the expanded beam on said substrate to-be-etched in a direction oblique thereto.

14. An etching apparatus according to claim 8, wherein said illumination means projects light of specified wavelengths on said substrate to-be-etched in a direction perpendicular thereto by the use of a filter.

* * * * *